(12) United States Patent
Lee et al.

(10) Patent No.: US 11,735,275 B2
(45) Date of Patent: Aug. 22, 2023

(54) HIGH VOLTAGE SWITCH CIRCUIT AND SEMICONDUCTOR MEMORY DEVICE HAVING THE SAME

(71) Applicant: SK hynix Inc., Gyeonggi-do (KR)

(72) Inventors: Hyun Soo Lee, Gyeonggi-do (KR); Sun Young Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 227 days.

(21) Appl. No.: 17/330,943

(22) Filed: May 26, 2021

(65) Prior Publication Data

US 2022/0172790 A1 Jun. 2, 2022

(30) Foreign Application Priority Data

Nov. 30, 2020 (KR) .................. 10-2020-0164541

(51) Int. Cl.
*G11C 16/10* (2006.01)
*G11C 16/30* (2006.01)
*G11C 16/08* (2006.01)

(52) U.S. Cl.
CPC .............. *G11C 16/30* (2013.01); *G11C 16/08* (2013.01)

(58) Field of Classification Search
CPC ........................................................ G11C 16/10
USPC .................................................... 365/185.18
See application file for complete search history.

(56) References Cited

U.S. PATENT DOCUMENTS

2016/0343450 A1* 11/2016 Lee .................. H10B 43/10

FOREIGN PATENT DOCUMENTS

KR           10-1200021 B1      11/2012
KR       10-2018-0097110 A       8/2018

\* cited by examiner

*Primary Examiner* — Jason Lappas
(74) *Attorney, Agent, or Firm* — IP & T Group LLP

(57) ABSTRACT

A high voltage switch circuit and a semiconductor memory device having the same are provided. The high voltage switch circuit includes a switching circuit for outputting a high voltage by transmitting one of a plurality of pump voltages to an output node; and a discharge circuit connected between the output node and a terminal of an internal power voltage, the discharge circuit discharging the high voltage to a level of the internal power voltage. The discharge circuit includes a triple well transistor.

11 Claims, 8 Drawing Sheets

ND SEMICONDUCTOR MEMORY DEVICE
HIGH VOLTAGE SWITCH CIRCUIT AND SEMICONDUCTOR MEMORY DEVICE HAVING THE SAME

CROSS-REFERENCE TO RELATED APPLICATION

The present application claims priority under 35 U.S.C. § 119(a) to Korean patent application number 10-2020-0164541, filed on Nov. 30, 2020, which is incorporated herein by reference in its entirety.

BACKGROUND

Field of Invention

The present disclosure generally relates to an electronic device, and more particularly, to a high voltage switch circuit and a semiconductor memory device having the same.

Description of Related Art

A semiconductor device, particularly, a semiconductor memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied. Examples of the nonvolatile memory include a read only memory (ROM), a mask ROM (MROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is classified into a NOR type flash memory and a NAND type flash memory.

The flash memory has an advantage of the RAM in which data is freely programmed and erased, and an advantage of the ROM in which stored data is retained even when the supply of power is interrupted. The flash memory is widely used as a storage medium of a portable electronic device, such as a digital camera, a personal digital assistant (PDA), and an MP3 player.

SUMMARY

Embodiments of the present disclosure provide a high voltage switch circuit capable of rapidly discharging a high voltage supplied to a block decoder, and a semiconductor memory device having the high voltage switch circuit.

In accordance with an aspect of the present disclosure, there is provided a high voltage switch circuit including: a switching circuit configured to output a high voltage by transmitting one of a plurality of pump voltages to an output node; and a discharge circuit connected between the output node and a terminal of an internal power voltage, the discharge circuit discharging the high voltage to a level of the internal power voltage, wherein the discharge circuit includes a triple well transistor.

In accordance with another aspect of the present disclosure, there is provided a semiconductor memory device including: a memory cell array including a plurality of memory blocks; a pass circuit corresponding to each of the plurality of memory blocks, the pass circuit including a plurality of pass circuits connecting global word lines to local word lines of each of the plurality of memory blocks in response to a plurality of block select signals; a plurality of block decoders corresponding to each of the plurality of memory blocks, the plurality of block decoders generating one of the plurality of block select signals by using a high voltage; and a high voltage switch circuit configured to output a high voltage by switching one of a plurality of pump voltages, wherein the high voltage switch circuit includes a triple well transistor.

In accordance with still another aspect of the present disclosure, there is provided a semiconductor memory device including: a memory cell array including a first memory block and a second memory block; a pass circuit including a first pass circuit for connecting global word lines to local word lines of the first memory block in response to a first block select signal and a second pass circuit for connecting the global word lines to local word lines of the second memory block in response to a second block select signal; a first block decoder corresponding to the first memory block, the first block decoder generating and outputting the first block select signal when the first memory block is a selected memory block; a second block decoder corresponding to the second memory block, the second block decoder generating and outputting the second block select signal when the second memory block is the selected memory block; and a high voltage switch circuit configured to receive a plurality of pump voltages, and supply one of the plurality of pump voltages as a high voltage to the first and second block decoders, wherein the high voltage switch circuit discharges the high voltage to a set level, when a general operation of the selected memory block is completed.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Hereinafter, various embodiments of the present disclosure will be described in detail with reference to the accompanying drawings in order for those skilled in the art to be able to readily implement the technical spirit of the present disclosure.

Figure 1:
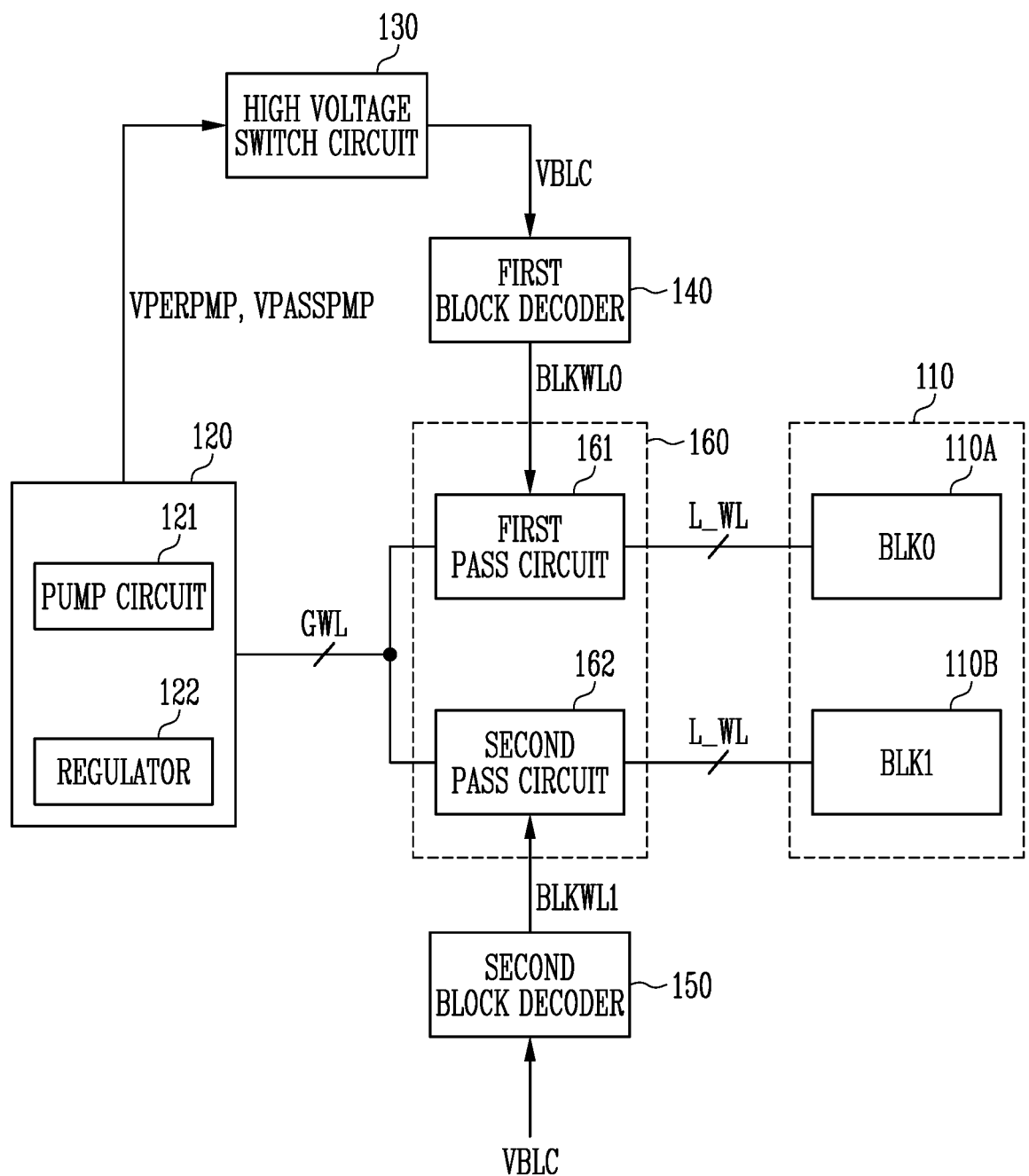
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device may include a memory cell array 110, a voltage generating circuit 120, a high voltage switch circuit 130, first and second block decoders 140 and 150, and a pass circuit 160.

The memory cell array 110 may include a plurality of memory blocks. In an embodiment of the present disclosure, by way of example, the memory cell array 110 includes a first memory block BLK0 110A and a second memory block BLK1 110B which is described and illustrated. However, the present disclosure is not limited thereto, and the memory cell array 110 may include at least two memory blocks.

Each of the first memory block BLK0 110A and the second memory block BLK1 110B may include a plurality of memory cells. For example, the plurality of memory cells may be nonvolatile memory cells. A plurality of memory cells connected to the same word line may be defined as one page. Also, each of the first memory block BLK0 110A and the second memory block BLK1 110B may include a plurality of cell strings.

Local word lines L_WL may be connected between the first memory block BLK0 110A and a first pass circuit 161 of the pass circuit 160. Local word lines L_WL may be connected between the second memory block BLK1 110B and a second pass circuit 162 of the pass circuit 160.

The voltage generating circuit 120 may generate operating voltages to be applied to the local word lines L_WL of a memory block selected from the first memory block BLK0 110A and the second memory block BLK1 110B, which are included in the memory cell array 110, in a program operation, a read operation, or an erase operation. Further, the voltage generating circuit 120 may output the generated operating voltages to global word lines GWL.

Also, the voltage generating circuit 120 may generate a program pump voltage VPERPMP, a pass pump voltage VPASSPMP, and the like, and output the generated voltages to the high voltage switch circuit 130.

The voltage generating circuit 120 may include a pump circuit 121 and a regulator 122. The pump circuit 121 may generate the program pump voltage VPERPMP, the pass pump voltage VPASSPMP, and the like by performing a pumping operation. The regulator 122 may generate operating voltages to be output to the global word lines GWL by regulating the voltages generated by the pump circuit 121.

The high voltage switch circuit 130 may generate a high voltage VBLC in response to the operating voltage. The high voltage switch circuit 130 may output the high voltage VBLC to the first block decoder 140 and the second block decoder 150 by switching the program pump voltage VPERPMP, the pass pump voltage VPASSPMP, and the like, which are received from the voltage generating circuit 120. For example, in a program operation, the high voltage switch circuit 130 may output the high voltage VBLC by switching the program pump voltage VPERPMP. In a read operation, the high voltage switch circuit 130 may output the high voltage VBLC by switching the pass pump voltage VPASSPMP. The high voltage VBLC may be greater than the operating voltage.

When an operation being performed currently is completed, the high voltage switch circuit 130 may discharge the high voltage VBLC having a potential of the program pump voltage VPERPMP or a potential of the pass pump voltage VPASSPMP to a potential of an internal power voltage.

The first block decoder 140 may correspond to the first pass circuit 161 and the first memory block BLK0 110A. The second block decoder 150 may correspond to the second pass circuit 162 and the second memory block BLK1 110B.

When the first memory block BLK0 110A is selected in a program operation, a read operation, or an erase operation, the first block decoder 140 may generate and output a first block select signal BLKWL0 by using the high voltage VBLC received from the high voltage switch circuit 130.

When the second memory block BLK1 110B is selected in a program operation, a read operation, or an erase operation, the second block decoder 150 may generate and output a second block select signal BLKWL1 by using the high voltage VBLC received from the high voltage switch circuit 130.

The pass circuit 160 may include a plurality of pass circuits corresponding to each of the plurality of memory blocks included in the memory cell array 110. For example, the pass circuit 160 may include the first pass circuit 161 corresponding to the first memory block BLK0 110A and the second pass circuit 162 corresponding to the second memory block BLK1 110B.

The first pass circuit 161 may be electrically connected between the global word lines GWL and the local word lines L_WL of the first memory block BLK0 110A. The first pass circuit 161 may electrically connect the global word lines GWL and the local word lines L_WL of the first memory block BLK0 110A to each other in response to the first block select signal BLKWL0. That is, the first pass circuit 161 may output operating voltages received through the global word lines GWL to the local word lines L_WL of the first memory block BLK0 110A.

The second pass circuit 162 may be electrically connected between the global word lines GWL and the local word lines L_WL of the second memory block BLK1 110B. The second pass circuit 162 may electrically connect the global word lines GWL and the local word lines L_WL of the second memory block BLK1 110B to each other in response to the second block select signal BLKWL1. That is, the second pass circuit 162 may output operating voltages received through the global word lines GWL to the local word lines L_WL of the second memory block BLK1 110B.

In the above-described semiconductor memory device, the high voltage VBLC is to be rapidly discharged before an operation on another memory block (e.g., BLK1) included in the memory cell array 110 is performed after a program operation on one memory block (e.g., BLK0) included in the memory cell array 110 is completed. For example, when a read operation on the second memory block BLK1 110B is performed after a program operation on the first memory block BLK0 110A, the first block decoder 140 corresponding to the first memory block BLK0 110A may be continuously supplied with the high voltage VBLC higher than a set potential. Thus, the first block select signal BLKWL0 may maintain an activation state in the read operation of the second memory block BLK1 110B, when the high voltage VBLC generated by switching the program pump voltage VPERPMP is not discharged to the set potential until a start time of the read operation on the second memory block BLK1 110B in the program operation of the first memory block BLK0 110A. Accordingly, an operating voltage may be applied to the local word lines L_WL of the first memory block BLK0 110A in the read operation on the second memory block BLK1 110B. In order to prevent this, when an operation on a selected memory block is completed, the high voltage switch circuit 130 is to discharge the high voltage VBLC to a state lower than the set potential before the operation on the selected memory block is performed.

Figure 2:
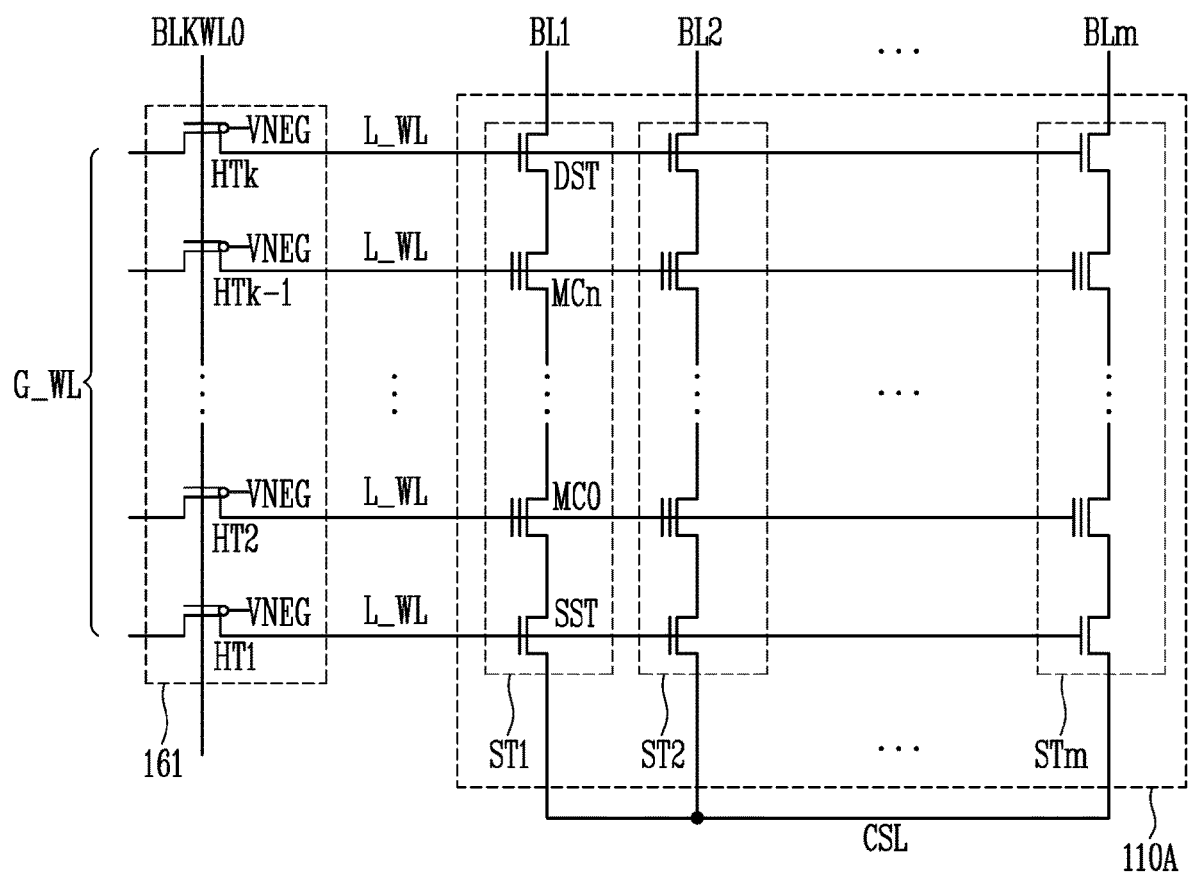
FIG. 2 is a circuit diagram illustrating in detail a first memory block and a first pass circuit, which are shown in FIG. 1.

FIG. 2 is a circuit diagram illustrating in detail the first memory block 110A and the first pass circuit 161, which are shown in FIG. 1.

The first memory block 110A and the second memory block 110B, which are shown in FIG. 1, may have structures similar to each other. The first pass circuit 161 and the second pass circuit 162, which are shown in FIG. 1, may have structures similar to each other. In an embodiment of the present disclosure, by way of example, the first memory block 110A and the first pass circuit 161 will be described.

Referring to FIG. 2, the first memory block 110A may include a plurality of cell strings ST1 to STm respectively connected between a common source line CSL and a plurality of bit lines BL1 to BLm. The plurality of cell strings ST1 to STm may have the same structure. A first cell string ST1 may include a source select transistor SST, a plurality of memory cells MC0 to MCn, and a drain select transistor DST, which are connected in series between the common source line CSL and a bit line BL1. The source select transistor SST, the plurality of memory cells MC0 to MCn, and the drain select transistor DST may be respectively connected to local word lines L_WL.

The first pass circuit 161 may be connected between global word lines G_WL and the local word lines L_WL. The first pass circuit 161 may include a plurality of high voltage transistors HT1 to HTk which are turned on or turned off in response to the first block select signal BLKWL0 output from the first block decoder 140 shown in FIG. 1.

The first pass circuit 161 may transfer a plurality of operating voltages generated by the voltage generating circuit 120 shown in FIG. 1 to the first memory block 110A or block the plurality of operating voltages from being transferred to the first memory block 110A in response to the first block select signal BLKWL0. When the first memory block 110A is a selected memory block, the first block select signal BLKWL0 having a high potential level is applied to the first pass circuit 161. Therefore, the plurality of high voltage transistors HT1 to HTk may all be turned on, and the plurality of operating voltages may be transferred to the first memory block 110A. Also, when the first memory block 110A is an unselected memory block, the first block select signal BLKWL0 having a negative potential level may be applied to the pass circuit 160. Therefore, the plurality of high voltage transistors HT1 to HTk may all be turned on, and the first pass circuit 161 may block the plurality of operating voltages from being transferred to the first memory block 110A.

Figure 3:
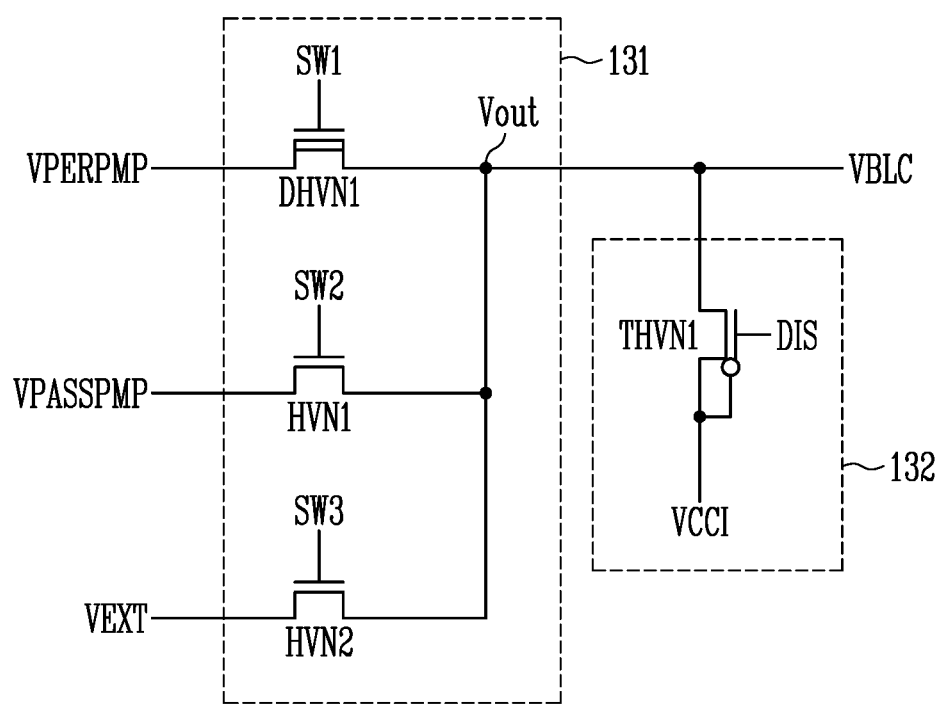
FIG. 3 is a circuit diagram illustrating in detail a high voltage switch circuit shown in FIG. 1.

FIG. 3 is a circuit diagram illustrating in detail the high voltage switch circuit 130 shown in FIG. 1.

Referring to FIG. 3, the high voltage switch circuit 130 may include a switching circuit 131 and a discharge circuit 132.

The switching circuit 131 may be configured with a plurality of switching elements. A depletion transistor DHVN1 may receive a program pump voltage VPERPMP, and output the program pump voltage VPERPMP to an output node Vout in response to a first switching signal SW1. A first high voltage transistor HVN1 may receive a pass pump voltage VPASSPMP, and output the pass pump voltage VPASSPMP to the output node Vout in response to a second switching signal SW2. A second high voltage transistor HVN2 may receive an external voltage VEXT, and output the external voltage VEXT to the output node Vout in response to a third switching signal SW3. The output node Vout may output a high voltage VBLC to the first and second block decoders 140 and 150.

The discharge circuit 132 may discharge a potential of the output node Vout. For example, the discharge circuit 132 may discharge the potential of the output node Vout to a level of an internal power voltage VCCI before a general operation of a next memory block is performed after a general operation of a selected memory block is completed. The next memory block represents a memory block to be selected after the selected memory block. The general operation represents an operation such as one of read, write and erase operations as described above.

The discharge circuit 132 may be configured with a triple well transistor THVN1. The triple well transistor THVN1 may be connected between the output node Vout and a terminal through which the internal power voltage VCCI is received. The triple well transistor THVN1 may discharge the potential of the output node Vout to the level of the internal power voltage VCCI in response to a discharge signal DIS. The discharge signal DIS may be activated after the general operation of the selected memory block is completed, and be inactivated before the general operation of the next memory block is performed.

Figure 4:
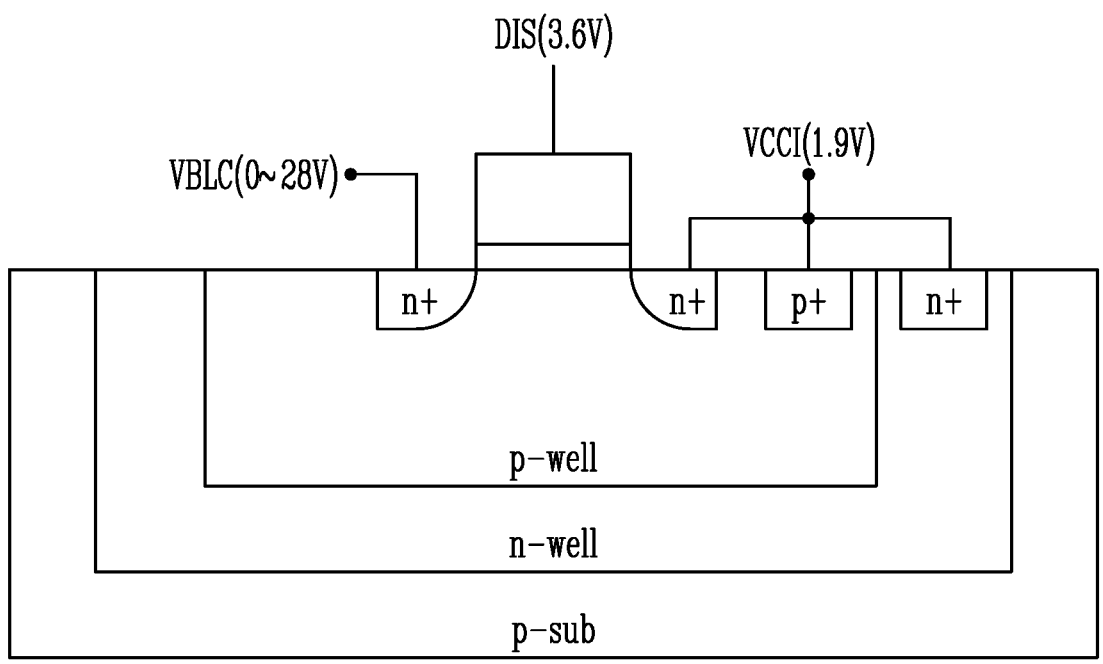
FIG. 4 is a sectional view illustrating a triple well transistor shown in FIG. 3.

FIG. 4 is a sectional view illustrating the triple well transistor THVN1 shown in FIG. 3.

Referring to FIG. 4, a high voltage VBLC having a potential of, for example, 0 to 28V is applied to a drain n+ of the triple well transistor. An internal power voltage VCCI of, for example, 1.9V is applied to a source n+ of the triple well transistor. A discharge signal DIS of, for example, 3.6 V in activation is applied to a gate of the triple well transistor. The internal power voltage VCCI applied to the source n+ is applied to a p-well as a body of the triple well transistor. Thus, no body effect occurs. Accordingly, the triple well transistor may rapidly discharge the high voltage VBLC to the internal power voltage VCCI in response to the discharge signal DIS. In an embodiment of the present disclosure, the internal power voltage VCCI may also be applied to an n-well surrounding the p-well, thereby blocking current flow between the p-well and the n-well.

As described above, in the present disclosure, the discharge circuit 132 included in the high voltage switch circuit 130 is configured with the triple well transistor, so that the high voltage VBLC may be discharged to the level of the internal power voltage VCCI within a short time. For example, after a general operation on a selected memory block is completed, the high voltage VBLC is rapidly discharged by using the discharge circuit 132. Thus, an operating voltage may not be applied to word lines of an unselected memory block in a general operation on a next selected memory block.

Figure 5:
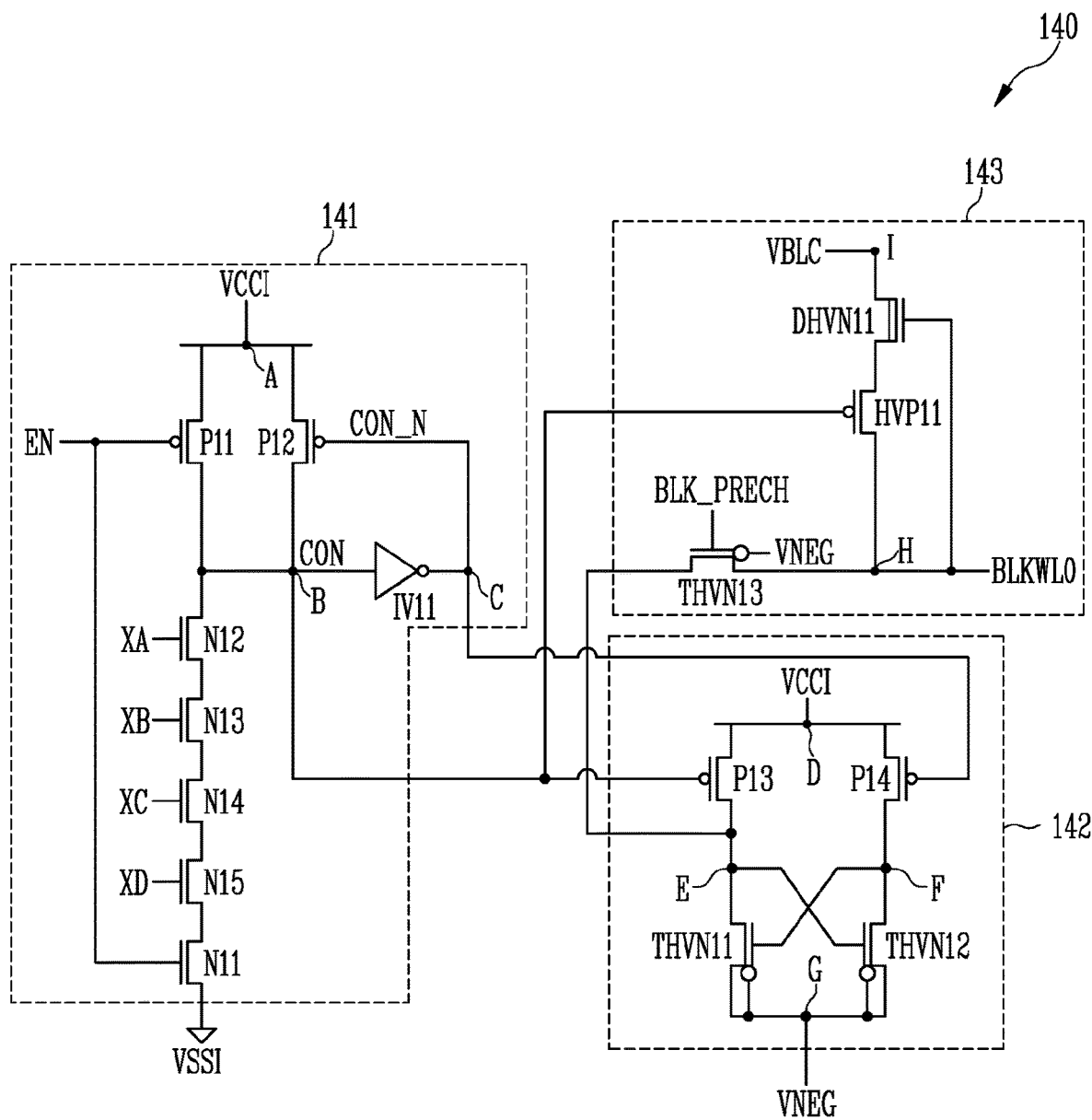
FIG. 5 is a circuit diagram illustrating in detail a first block decoder shown in FIG. 1.

FIG. 5 is a circuit diagram illustrating in detail the first block decoder 140 shown in FIG. 1.

The first block decoder 140 and the second block decoder 150, which are shown in FIG. 1, may have structures similar to each other, and the first block decoder 140 will be described as an example.

Referring to FIG. 5, the first block decoder 140 may include a control signal generating circuit 141, a potential level switch circuit 142, and a voltage applying circuit 143.

The control signal generating circuit 141 may include a plurality of NMOS transistors N11 to N15, PMOS transistors P11 and P12, and an inverter IV11. PMOS transistor P11 is connected between a node B and a node A to which an internal power voltage VCCI is applied, and is turned on or turned off in response to an enable signal EN. The plurality of NMOS transistors N12 to N15 and N11 are connected in series between the node B and a terminal to which a ground voltage VSSI is applied. The plurality of NMOS transistors N12 to N15 are turned on or turned off respectively in response to decoded address signals XA, XB, XC, and XD. The NMOS transistor N11 is turned on or turned off in response to the enable signal EN. The inverter IV11 is connected between the node B and a node C. The inverter IV11 outputs an inverting control signal CON_N to the node C by inverting a control signal CON corresponding to a potential level of the node B. The PMOS transistor P12 is connected between the node B and the node A to which the internal power voltage VCCI is applied, and is turned on or turned off in response to the inverting control signal CON_N.

The potential level switch circuit 142 may include PMOS transistors P13 and P14 and triple well transistors THVN11 and THVN12. The PMOS transistor P13 is connected between a node E and a node D to which the internal power voltage VCCI is applied, and is turned on or turned off in response to the control signal CON. The PMOS transistor P14 is connected between a node F and the node D to which the internal power voltage VCCI is applied, and is turned on or turned off in response to the inverting control signal CON_N. The triple well transistor THVN11 is connected between the node E and a node G to which a negative voltage VNEG is applied, and is turned on or turned off in response to a potential level of the node F. The triple well transistor THVN12 is connected between the node F and the node G to which a negative voltage VNEG is applied, and is turned on or turned off in response to a potential level of the node E.

The voltage applying circuit 143 may include a depletion transistor DHVN11, a high voltage transistor HVP11, and a triple well transistor THVN13. The depletion transistor DHVN11 and the high voltage transistor HVP11 are connected in series between a node H and a node I to which a high voltage VBLC is applied. The depletion transistor DHVN11 is turned on or turned off in response to a potential level of the node H. A threshold voltage of the depletion transistor DHVN11 has a negative value. Therefore, when a voltage of 0V or higher is applied to a gate of the depletion transistor DHVN11, the depletion transistor DHVN11 is turned on. The high voltage transistor HVP11 is turned on or turned off in response to the control signal CON. The high voltage transistor HVP11 may be configured as a PMOS transistor. The triple well transistor THVN13 is connected between the node E and the node H, and is turned on or turned off in response to a block precharge signal BLK_PRECH.

An operation of the first block decoder 140 will be described as follows.

The enable signal EN is applied with a logic low level to the PMOS transistor P11, and the PMOS transistor P11 is turned on. Therefore, the node B is initialized to have a potential level of the internal power voltage VCCI.

Subsequently, the enable signal EN is activated to the level of the internal power voltage VCCI. When the first memory block 110A in FIG. 1 corresponding to the first block decoder 140 is a selected memory block, the decoded address signals XA, XB, XC, and XD are all applied with a logic high level, and the plurality of NMOS transistors N12 to N15 are turned on. Accordingly, the ground voltage VSSI is applied to the node B, and the control signal CON corresponding to the potential level of the node B becomes the low logic level. The inverting control signal CON_N becomes a logic high level through the inverter IV11. The inverting control signal CON_N having the logic low level is applied to the PMOS transistor P13 included in the potential level switch circuit 142. Therefore, the PMOS transistor P13 is turned on, and the internal power voltage VCCI is output to the node E. The triple well transistor THVN13 is controlled by the internal power voltage VCCI and the block precharge signal BLK_PRECH having a potential level of a high voltage VH higher than the internal power voltage VCCI. For a set time, the block precharge signal BLK_PRECH is applied with the potential level of the high voltage VH to the triple well transistor THVN13, so that the triple well transistor THVN13 is turned on. Therefore, the internal power voltage VCCI output to the node E is transferred to the node H. After the set time, the block precharge signal BLK_PRECH is decreased to the potential level of the internal power voltage VCCI and then applied to the triple well transistor THVN13. The depletion transistor DHVN11 is turned on in response to the potential level of the node H, and the high voltage VBLC is output to the high voltage transistor HVP11 through the node I. The control signal CON having the logic low level is applied to the high voltage transistor HVP11, so that the high voltage transistor HVP11 is turned on. Therefore, the high voltage VBLC is transferred to the node H. Accordingly, the potential level of the node H is further increased, and an amount of current flowing through the depletion transistor DHVN11 is further increased. Therefore, the potential level of the node H is increased by the level of the high voltage VBLC, and a block select signal BLKWL is output with the level of the high voltage VBLC. The first block select signal BLKWL0 having the potential level of the high voltage VBLC is output from the first block decoder 140, and correspondingly, a plurality of operating voltages generated by the voltage generating circuit 120 in FIG. 1 are transferred to the first memory block 110A in FIG. 1.

When the first memory block 110A in FIG. 1 corresponding to the first block decoder 140 is an unselected memory block, at least one of the decoded address signals XA, XB, XC, and XD is applied with the logic low level, and the node B maintains the potential level of the internal power voltage VCCI. That is, the control signal CON corresponding to the potential level of the node B maintains the logic high level.

The inverting control signal CON_N becomes the logic low level through the inverter IV11. The inverting control signal CON_N having the logic low level is applied to the PMOS transistor P14 included in the potential level switch circuit 142, and the PMOS transistor P14 is turned on. Therefore, the internal power voltage VCCI is transferred to the node F. The triple well transistor THVN11 is turned on in response to the potential level of the node F. Therefore, the negative voltage VNEG applied to the node G is output to the node E through the triple well transistor THVN11. The triple well transistor THVN13 is controlled by the internal power voltage VCCI and the block precharge signal BLK_PRECH having the potential level of the high voltage VH higher than the internal power voltage VCCI. The negative voltage VNEG output to the node E is transferred to the node H through the triple well transistor THVN13. The control signal CON having the logic high level is applied to the high voltage transistor HVP11, and the high voltage transistor HVP11 is turned off. The depletion transistor DHVN11 is turned off as the node H has a negative potential level. Therefore, the negative voltage VNEG transferred to the node H is output as the block select signal BLKWL. That is, the first block select signal BLKWL0 having the potential level of the negative voltage VNEG is output from the first block decoder 140, and the first pass circuit 161 in FIG. 1 blocks the plurality of operating voltages generated by the voltage generating circuit 120 in FIG. 1 from being transferred to the first memory block 110A in FIG. 1.

Figure 6:
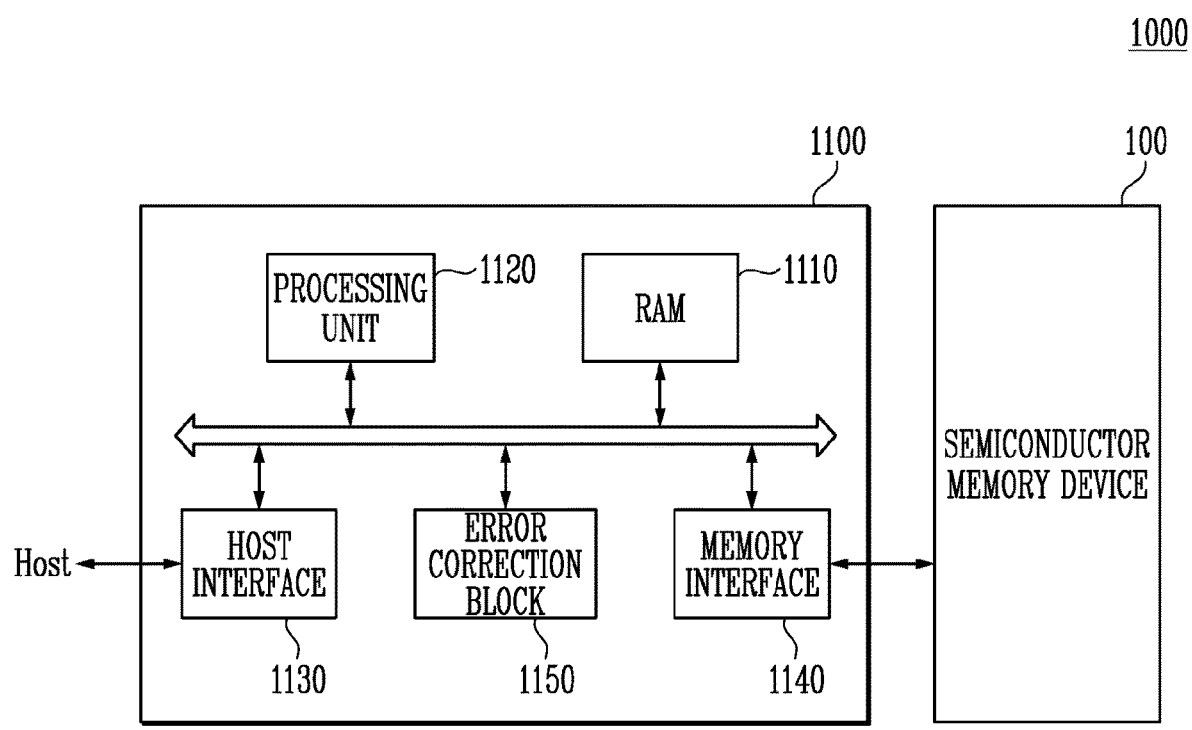
FIG. 6 is a block diagram illustrating a memory system including the semiconductor memory device shown in FIG. 1.

FIG. 6 is a block diagram illustrating a memory system 1000 including the semiconductor memory device shown in FIG. 1.

Referring to FIG. 6, the memory system 1000 may include a semiconductor memory device 100 and a controller 1100.

The semiconductor memory device 100 may be configured and operated identically to the semiconductor memory device described with reference to FIG. 1.

The controller 1100 may be connected between a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the semiconductor memory device 100 and the host Host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 210 may be used as any of a working memory of the processing unit 1120, a cache memory between the semiconductor memory device 100 and the host Host, and a buffer memory between the semiconductor memory device 100 and the host Host. The processing unit 1120 may control overall operations of the controller 1100. In addition, the controller 1100 may temporarily store program data provided from the host Host in a write operation.

The host interface 1130 may include a protocol for exchanging data between the host Host and the controller 1100. In an embodiment, the controller 1100 may communicate with the host Host through at least one of various interface protocols such as a Universal Serial Bus (USB) protocol, a Multi-Media Card (MMC) protocol, a Peripheral Component Interconnection (PCI) protocol, a PCI-Express (PCI-e or PCIe) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The memory interface 1140 may interface with the semiconductor memory device 100. For example, the memory interface 1140 may include a NAND interface or a NOR interface.

The error correction block 1150 may detect and correct an error of data received from the semiconductor memory device 100 by using an error correction code (ECC). The processing unit 1120 may control the semiconductor memory device 100 to adjust a read voltage, based on an error detection result of the error correction block 1150, and perform re-reading. In an embodiment, the error correction block 1150 may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (Personal Computer Memory Card International Association (PCMCIA)), a Compact Flash (CF) card, a Smart Media Card (e.g., SM or SMC), a memory stick, a Multi-Media Card (e.g., MMC, RS-MMC or MMCmicro), a secure digital (SD) Card (e.g., SD, miniSD, microSD or SDHC), or a Universal Flash Storage (UFS).

The controller 1100 and the semiconductor memory device 100 may be integrated into one semiconductor device to constitute a semiconductor drive (i.e., solid state drive (SSD)). The semiconductor drive SSD includes a storage device configured to store data in a semiconductor memory. When the memory system 1000 is used as the semiconductor drive SSD, the operating speed of the host Host connected to the memory system 1000 can be remarkably improved.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 7:
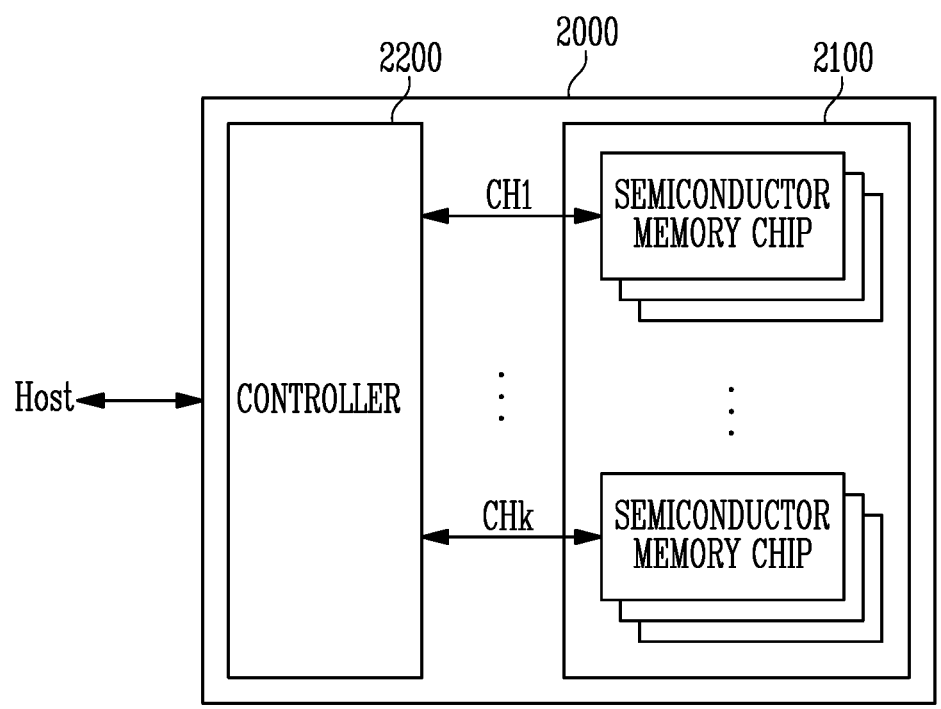
FIG. 7 is a block diagram illustrating an application example of the memory system shown in FIG. 6.

FIG. 7 is a block diagram illustrating an application example of the memory system shown in FIG. 6.

Referring to FIG. 7, the memory system 2000 includes a semiconductor memory device 2100 and a controller 2200.

The semiconductor memory device 2100 includes a plurality of semiconductor memory chips. The plurality of semiconductor memory chips are divided into a plurality of groups.

In FIG. 7, the plurality of groups communicate with the controller 2200 through first to kth channels CH1 to CHk. Each semiconductor memory chip may be configured and operated identically to the semiconductor memory device 100 described with reference to FIG. 1.

Each group may communicate with the controller 2200 through one common channel. The controller 2200 may be configured identically to the controller 200 described with reference to FIG. 6, and control the plurality of memory chips of the semiconductor memory device 2100 through the plurality of channels CH1 to CHk.

Figure 8:
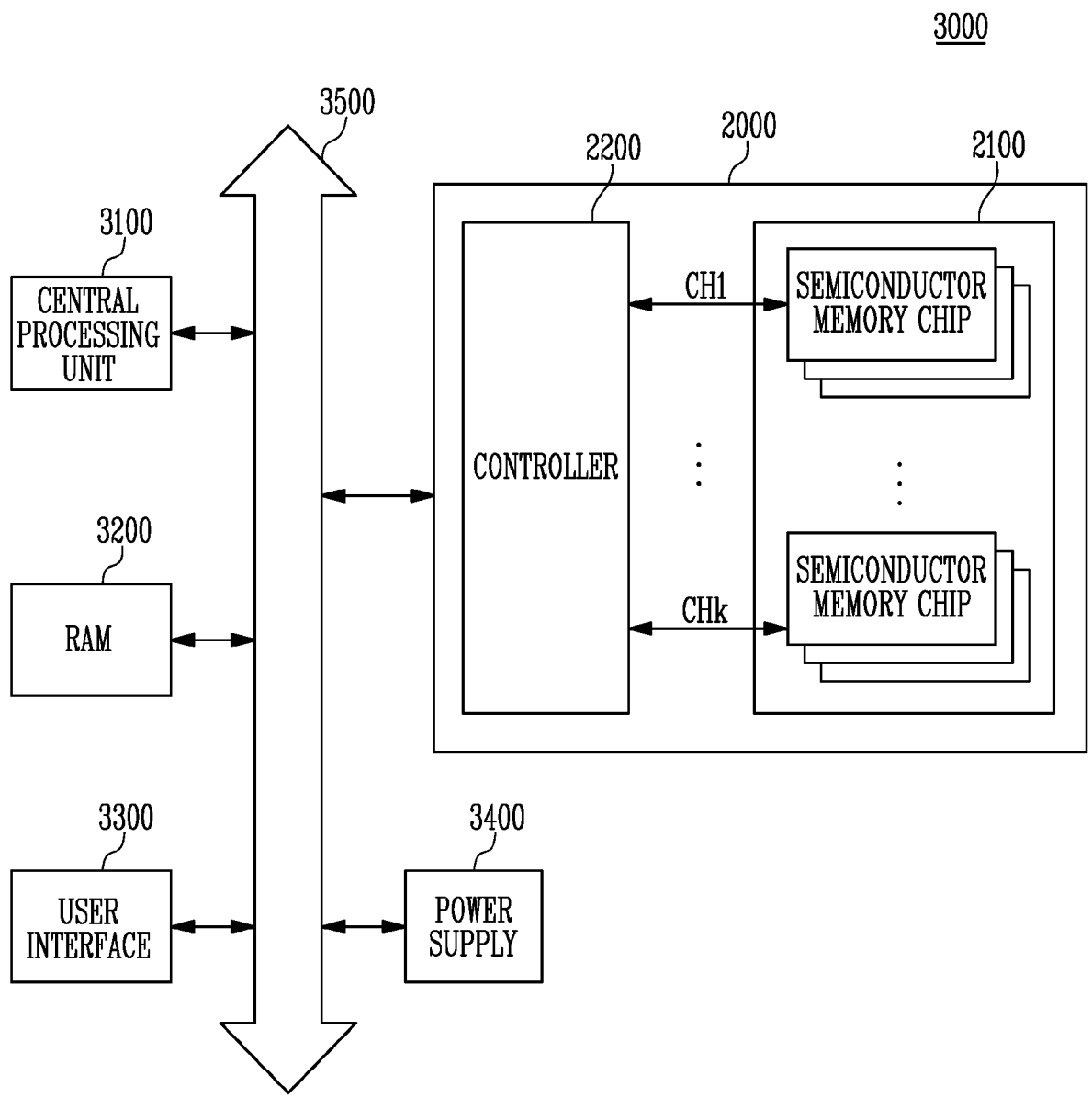
FIG. 8 is a block diagram illustrating a computing system including the memory system described with reference to FIG. 7.

FIG. 8 is a block diagram illustrating a computing system 3000 including the memory system 2000 described with reference to FIG. 7.

Referring to FIG. 8, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data supplied through user interface 3300 or data processed by the central processing unit 3100 may be stored in the memory system 2000.

In FIG. 8, the semiconductor memory device 2100 is connected to the system bus 3500 through the controller 2200. However, the semiconductor memory device 2100 may be directly connected to the system bus 3500. The function of the controller 2200 may be performed by the central processing unit 3100 and the RAM 3200.

In FIG. 8, the memory system 2000 described with reference to FIG. 7 is illustrated. However, the memory system 2000 may be replaced by the memory system described with reference to FIG. 6. In an embodiment, the computing system 3000 may include both the memory systems 1000 and 2000 described with reference to FIGS. 6 and 7.

In accordance with the present disclosure, a high voltage supplied to a block decoder may be rapidly discharged, so that malfunction of an unselected memory block may be suppressed.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Various embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

While the present disclosure has been illustrated and described with respect to specific embodiments, the disclosed embodiments are provided for description, and not intended to be restrictive. Further, it is noted that the present disclosure may be achieved in various ways through substitution, change, and modification that fall within the scope of the following claims, as those skilled in the art will recognize in light of the present disclosure.

What is claimed is:

1. A semiconductor memory device comprising:
    a memory cell array including a plurality of memory blocks;
    a pass circuit component corresponding to each of the plurality of memory blocks, the pass circuit component including a plurality of pass circuits, each pass circuit connecting global word lines to local word lines of each of the plurality of memory blocks in response to each of a plurality of block select signals;
    a plurality of block decoders corresponding to the plurality of memory blocks, each of the plurality of memory blocks configured to generate one of the plurality of block select signals by using a high voltage; and
    a high voltage switch circuit configured to output a high voltage by switching one of a plurality of pump voltages,
    wherein the high voltage switch circuit includes a triple well transistor.

2. The semiconductor memory device of claim 1, wherein the high voltage switch circuit includes:
    a switching circuit configured to output the high voltage by transmitting one of the plurality of pump voltages to an output node; and
    a discharge circuit connected between the output node and a terminal of an internal power voltage, and configured to discharge the high voltage to a level of the internal power voltage.

3. The semiconductor memory device of claim 2, wherein the discharge circuit includes the triple well transistor.

4. The semiconductor memory device of claim 3, wherein the output node is connected to a drain of the triple well transistor, and the internal power voltage is applied to a source and a p-well of the triple well transistor.

5. The semiconductor memory device of claim 4, wherein the internal power voltage is applied to an n-well surrounding the p-well.

6. The semiconductor memory device of claim 2, wherein the discharge circuit discharges the high voltage to the level of the internal power voltage, when a general operation of a selected memory block among the plurality of memory blocks is completed.

7. A semiconductor memory device comprising:
    a memory cell array including a first memory block and a second memory block;
    a pass circuit component including a first pass circuit for connecting global word lines to local word lines of the first memory block in response to a first block select signal, and a second pass circuit for connecting the global word lines to local word lines of the second memory block in response to a second block select signal;

a first block decoder corresponding to the first memory block, and configured to generate and output the first block select signal when the first memory block is a selected memory block;

a second block decoder corresponding to the second memory block, and configured to generate and output the second block select signal when the second memory block is the selected memory block; and a high voltage switch circuit configured to receive a plurality of pump voltages, and supply one of the plurality of pump voltages as a high voltage to the first and second block decoders, wherein the high voltage switch circuit discharges the high voltage to a set level, when a general operation of the selected memory block is completed.

8. The semiconductor memory device of claim 7, wherein the high voltage switch circuit includes:
   a switching circuit configured to output the high voltage by transmitting one of the plurality of pump voltages to an output node; and
   a discharge circuit connected between the output node and a terminal of an internal power voltage, configured to discharge the high voltage to a level of the internal power voltage.

9. The semiconductor memory device of claim 8, wherein the discharge circuit includes a triple well transistor.

10. The semiconductor memory device of claim 9, wherein the output node is connected to a drain of the triple well transistor, and the internal power voltage is applied to a source and a p-well of the triple well transistor.

11. The semiconductor memory device of claim 10, wherein the internal power voltage is applied to an n-well surrounding the p-well.

* * * * *